United States Patent
Wang (10) Patent No.: US 11,201,090 B2
(45) Date of Patent: Dec. 14, 2021

(54) SEMICONDUCTOR STRUCTURES WITH ISOLATION STRUCTURES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 68 days.

(21) Appl. No.: 16/510,279

(22) Filed: Jul. 12, 2019

(65) Prior Publication Data
US 2020/0020592 A1    Jan. 16, 2020

(30) Foreign Application Priority Data
Jul. 12, 2018  (CN) .......................... 201810764562.1

(51) Int. Cl.
*H01L 21/8234* (2006.01)
*H01L 29/66* (2006.01)
(Continued)

(52) U.S. Cl.
CPC ............... *H01L 21/823481* (2013.01); *H01L 21/823418* (2013.01); *H01L 21/823431* (2013.01);
(Continued)

(58) Field of Classification Search
CPC ..... H01L 21/823481; H01L 21/823431; H01L 21/823418; H01L 21/823462; H01L 21/823437; H01L 21/823475; H01L 29/66545; H01L 29/4232; H01L 27/0886; H01L 29/41791; H01L 29/785; H01L 29/66795; H01L 29/0649
See application file for complete search history.

(56) References Cited

U.S. PATENT DOCUMENTS

| | | | |
|---|---|---|---|
| 2016/0204215 A1* | 7/2016 | Chang | H01L 21/823821 257/401 |
| 2018/0261596 A1* | 9/2018 | Jun | H01L 27/0886 |
| 2019/0131428 A1* | 5/2019 | Huang | H01L 27/0886 |

* cited by examiner

*Primary Examiner* — Nelson Garces
(74) *Attorney, Agent, or Firm* — Anova Law Group, PLLC (57) ABSTRACT

A method for fabricating a semiconductor structure includes forming fin structures on a base substrate; and forming dummy gate structures and first initial isolation structures. Along the extension direction of the dummy gate structures, both sides of each first initial isolation structure are in contact with a dummy gate structure. The method includes forming a first dielectric layer on the base substrate, the top and sidewall surfaces of the fin structures, and the sidewall surfaces of the dummy gate structures and the first initial isolation structure; removing the dummy gate structures to form dummy gate openings; and removing a portion of each first initial isolation structure along the width direction of the fin structures to form a first isolation structure. Along the width direction of the fin structures, the first isolation structure has a top dimension smaller than a bottom dimension. The method further includes forming gate structures.

11 Claims, 7 Drawing Sheets

(51) Int. Cl.
*H01L 29/423* (2006.01)
*H01L 27/088* (2006.01)
*H01L 29/417* (2006.01)

(52) U.S. Cl.
CPC ............... *H01L 21/823437* (2013.01); *H01L 21/823462* (2013.01); *H01L 21/823475* (2013.01); *H01L 27/0886* (2013.01); *H01L 29/41791* (2013.01); *H01L 29/4232* (2013.01); *H01L 29/66545* (2013.01)

SEMICONDUCTOR STRUCTURES WITH ISOLATION STRUCTURES AND FABRICATION METHODS THEREOF

CROSS-REFERENCES TO RELATED APPLICATIONS

This application claims the priority of Chinese Patent Application No. CN201810764562.1, filed on Jul. 12, 2018, the entire content of which is incorporated herein by reference.

FIELD OF THE DISCLOSURE

The present disclosure generally relates to the field of semiconductor fabrication technology and, more particularly, relates to semiconductor structures and fabrication methods thereof.

BACKGROUND

With the rapid development of semiconductor manufacturing technology, semiconductor devices are moving toward higher component densities and higher integration. As the most basic semiconductor device, transistor is widely used. The conventional planar transistor has weak control of the channel current, resulting in short channel effect (SCE), which leads to a leakage current and ultimately affects the electrical performance of the semiconductor device.

In current technology, in order to overcome the SCE and suppress the leakage current in semiconductor devices, a fin field effect transistor (Fin FET) has been adopted. The Fin FET is a common multi-gate device and includes a fin structure and an isolation layer disposed on the surface of a semiconductor substrate. The isolation layer covers a portion of the sidewall of the fin structure, and the surface of the isolation layer is lower than the top of the fin structure. The Fin FET also includes a gate structure formed on the surface of the isolation layer and covering the top and sidewall surfaces of the fin structure; and a source region and a drain region formed in the fin structure on the two sides of the gate structure, respectively.

However, the performance of semiconductor devices fabricated based on the existing technology may still need to be improved, the disclosed semiconductor structures and fabrication methods thereof are directed to solve one or more problems set forth above and other problems in the art.

BRIEF SUMMARY OF THE DISCLOSURE

One aspect of the present disclosure provides a method for fabricating a semiconductor structure. The method includes forming a plurality of fin structures on a base substrate; and forming a plurality of dummy gate structures across the plurality of fin structures, and a plurality of first initial isolation structures between adjacent dummy gate structures. Along the extension direction of the plurality of dummy gate structures, both sides of each first initial isolation structure of the plurality of first initial isolation structures are in contact with a dummy gate structure. The method also includes forming a first dielectric layer on a top surface of the base substrate, top and sidewall surfaces of the plurality of fin structures, sidewall surfaces of the plurality of dummy gate structures, and sidewall surfaces of the plurality of first initial isolation structure; removing the plurality of dummy gate structures to form a plurality of dummy gate openings in the first dielectric layer; and removing a portion of each first initial isolation structure along a width direction of the plurality of fin structures to form a first isolation structure. Along the width direction of the plurality of fin structures, the first isolation structure has a top dimension smaller than a bottom dimension. After forming the plurality of first isolation structures, the method further includes forming a plurality of gate structures in the plurality of dummy gate openings.

Another aspect of the present disclosure provides a semiconductor structure. The semiconductor structure includes a base substrate; a plurality of fin structures formed on the base substrate; a first dielectric layer formed on the top surface of the base substrate; and a plurality of first isolation structures formed in the first dielectric layer. Along the width direction of the plurality of fin structures, each first isolation structure of the plurality of first isolation structures has a top dimension smaller than a bottom dimension. The semiconductor structure also includes a plurality of dummy gate openings formed in the first dielectric layer on both sides of each first isolation structure. The plurality of dummy gate openings exposes sidewall surfaces of the plurality of first isolation structures. The semiconductor structure further includes a plurality of gate structures formed in the plurality of dummy gate openings.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

FIGS. 1-4 illustrate schematic views of structures at various stages in a process for fabricating a semiconductor structure.

Figure 1:
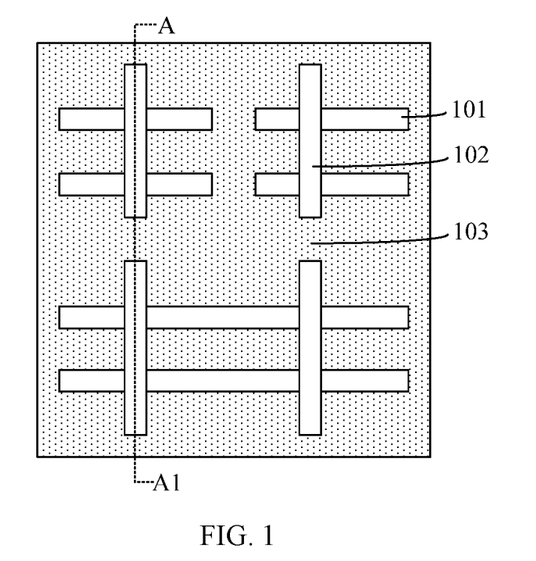
FIGS. 1-4 illustrate schematic views of structures at various stages in a process for fabricating a semiconductor structure.
Figure 2:
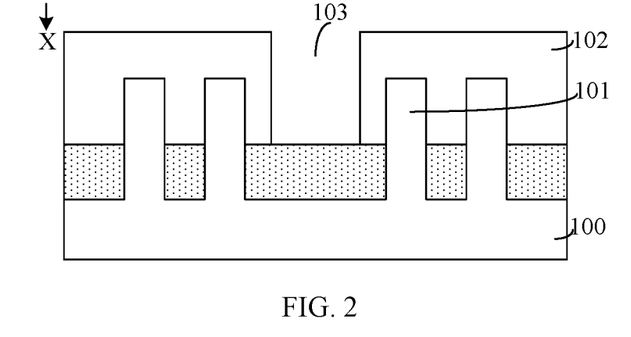

FIG. 1 illustrates a schematic top view of a semiconductor structure, and FIG. 2 illustrates a schematic cross-sectional view of the semiconductor structure shown in FIG. 1 along an A-A1 line. Referring to FIGS. 1-2, a base substrate 100 is provided, and a plurality of fin structures 101 are formed on the surface of the base substrate 100. The plurality of fin structures 101 are parallel to each other. Further, a plurality of dummy gate structures 102 are formed across the plurality of fin structures 101, and along the extension direction of the plurality of dummy gate structures 102, adjacent dummy gate structures 102 are separated by an opening 103. That is, a plurality of openings 103 are formed between adjacent dummy gate structures 102.

Figure 3:
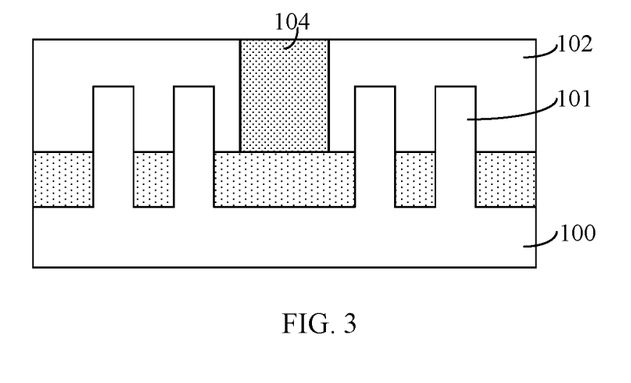

Referring to FIG. 3, a first dielectric layer 104 is formed on the top of the base substrate 100, the top and sidewall surfaces of the plurality of fin structures 101, and the sidewall surfaces of the plurality of dummy gate structures 102. The first dielectric layer 104 also fills into the plurality of openings 103.

Figure 4:
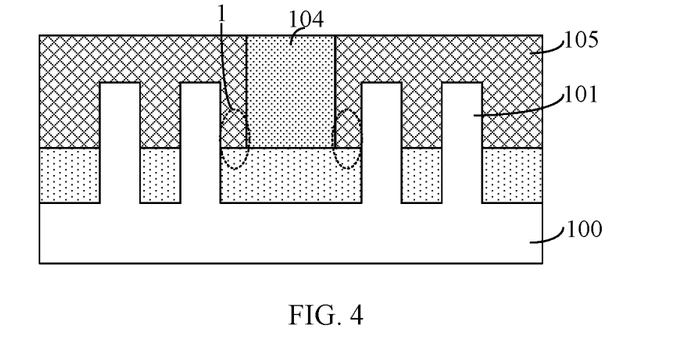

Referring to FIG. 4, after forming the first dielectric layer 104, the plurality of dummy gate structures 102 (referring to FIG. 3) are removed to form a plurality of dummy gate openings (not shown) in the first dielectric layer 104, and a plurality of gate structures 105 are then formed in the plurality of dummy gate openings.

According to the method described above, as the integration degree of the semiconductor devices is continuously increased, the size of the dummy gate structure 102 is required to be smaller and smaller. The method for forming a plurality of dummy gate structures 102 that have small sizes includes: forming a dummy gate structure film on the surface of the base substrate 100 and the sidewall and top surfaces of the fin structures 101; forming a plurality of initial dummy gate structures across the fin structures 101 by patterning the dummy gate structure film; and forming the plurality of dummy gate structures 102 by removing the portion of the dummy gate structure film formed between adjacent fin structures 101. In the process of removing the initial dummy gate structure formed between adjacent fin structures 101, the method further includes forming a plurality of openings 103 between adjacent fin structures 101.

However, due to the limitations of the actual patterning process, it is difficult to make the size of the openings 103 in the width direction of the fin structure 101 small. The distance between the adjacent fin structures 101 decreases as the integration degree increases, and thus the size of trench 1 (referring to FIG. 4) formed by each fin structure 101 and the portion of the first dielectric layer 104 in the opening 103 (referring to FIG. 2) is small along the width direction of the fin structure 101. Therefore, it is difficult to fill the trench 1 to form the gate structure 105. As a result, cavities may be easily generated when forming the gate structure 105 in the trench 1. As such, the gate structure 105 may not be able to provide desired control for the fin structure 101, and thus may not be conducive to improving the performance of semiconductor devices.

In order to solve the technical problem, the present disclosure provides a method for forming a semiconductor structure. According to the disclosed fabrication method, after forming a dummy gate opening, a portion of a first initial isolation structure is removed along the width direction of the fin structure to form a first isolation structure. As such, along the width direction of the fin structure, the size of the trench between the fin structure and the first isolation structure is increased. Therefore, the disclosed method is conducive to reducing the difficulty of subsequently forming the gate structure in the trench, and the formed gate structure is less likely to contain cavities. Accordingly, the gate structure may demonstrate strong ability for controlling the fin structure.

Figure 14:
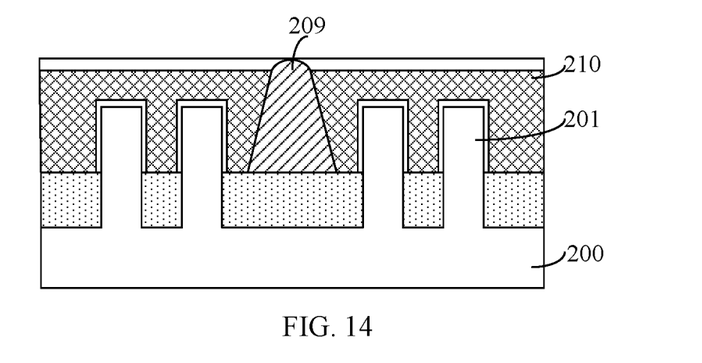
Figure 15:
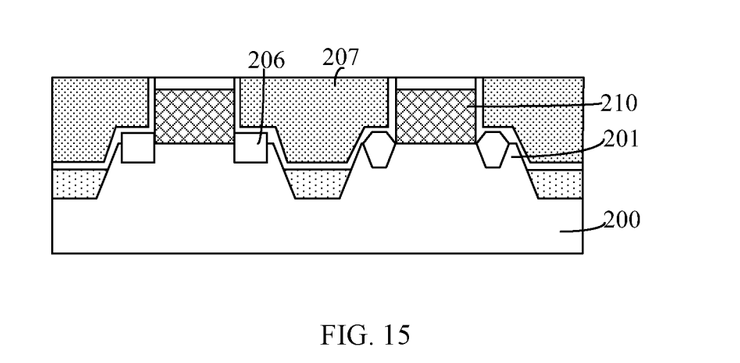
Figure 16:
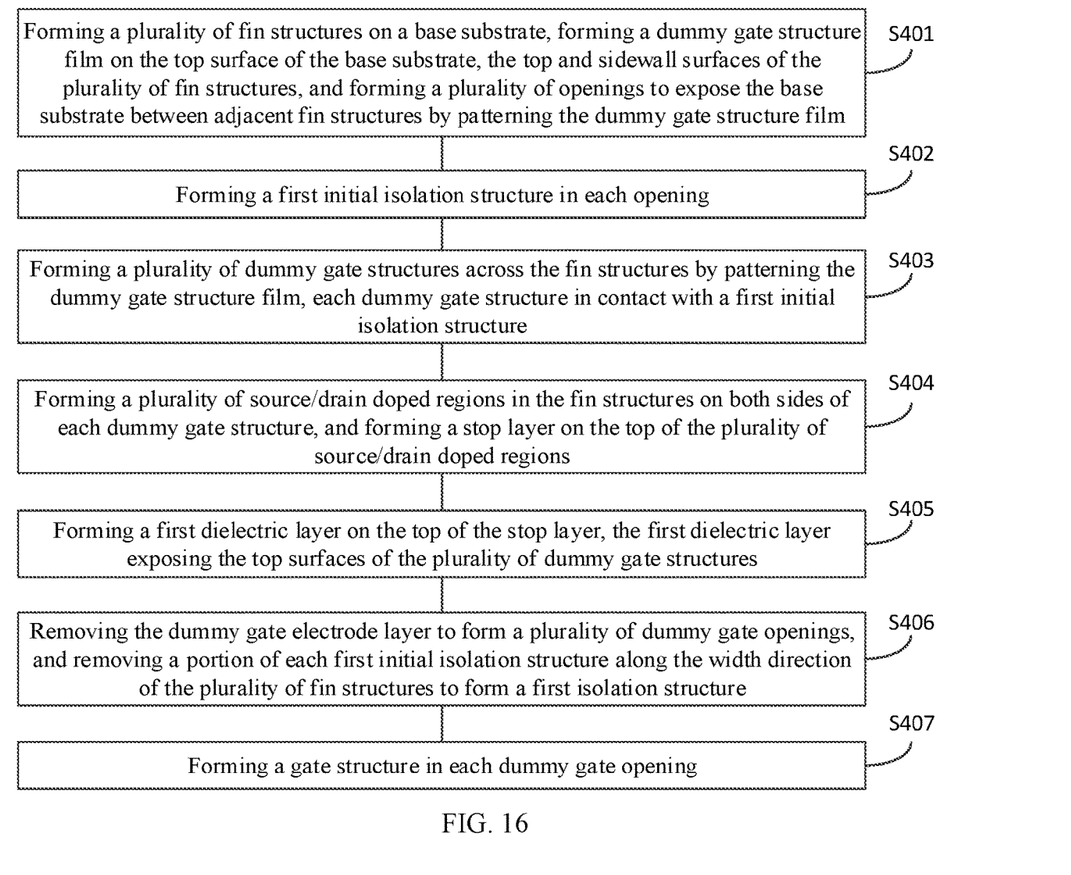
FIG. 16 illustrates a flowchart of an exemplary method for fabricating a semiconductor device consistent with various embodiments of the present disclosure.

The present disclosure provides a method for forming a semiconductor structure. FIG. 16 illustrates a flowchart of an exemplary method for fabricating a semiconductor device consistent with various embodiments of the present disclosure. FIGS. 5-15 illustrate schematic views of semiconductor structures at certain stages of the exemplary method.

Figure 5:
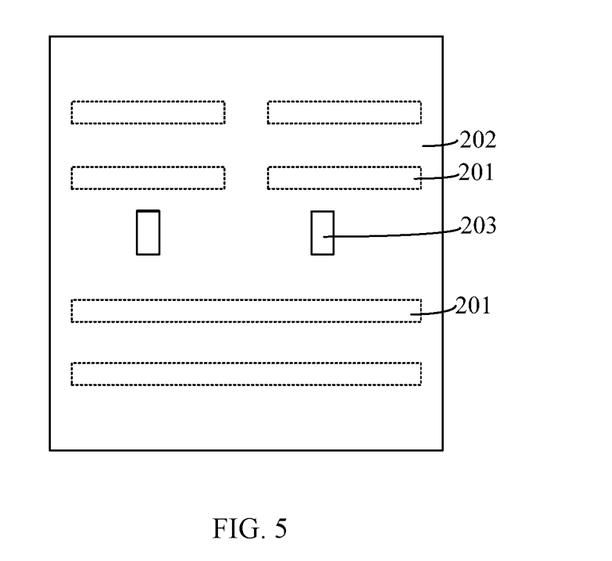
FIGS. 5-15 illustrate schematic views of semiconductor structures at certain stages of an exemplary method for fabricating a semiconductor structure consistent with some embodiments of the present disclosure.

Referring to FIG. 16, a plurality of fin structures may be formed on a base substrate, a dummy gate structure film may be formed on the top surface of the base substrate, the top and sidewall surfaces of the plurality of fin structures, and the dummy gate structure film may then be patterned to form a plurality of openings between adjacent fin structures to expose the base substrate (S401). FIG. 5 illustrates a schematic top view of an exemplary semiconductor structure consistent with various embodiments of the present disclosure.

Referring to FIG. 5, a base substrate 200 may be provided. A plurality of fin structures 201 may be formed on the surface of the base substrate 200. A dummy gate structure film 202 may be formed on the top surface of the base substrate 200 as well as the sidewall and top surfaces of each fin structure 201. A first patterning process may be performed on the dummy gate structure film 202 to form a plurality of openings 203 between adjacent fin structures 201. The plurality of openings 203 may expose the top surface of the base substrate 200.

In one embodiment, the process for forming the plurality of fin structures 201 on the base substrate 200 may include the following exemplary steps. An initial substrate may be provided. A first mask layer (not shown) may be formed on the initial substrate. The first mask layer may expose a portion of the top surface of the initial substrate. Further, the base substrate 200 and the plurality of fin structures 201 may be formed by etching the initial substrate using the first mask layer as an etch mask.

In one embodiment, the initial substrate may be made of silicon, and correspondingly, the base substrate 200 and the plurality of fin structures 201 may also be made of silicon.

In other embodiments, the initial substrate may be made of germanium, SiGe, silicon on insulator (SOI), or germanium on insulator (GOI), and correspondingly, the base substrate and the plurality of fin structures may also be made of germanium, SiGe, SOI, or GOI.

In one embodiment, the first mask layer may be made of silicon nitride or silicon oxynitride. The first mask layer may be used as the mask for forming the base substrate 200 and the plurality of fin structures 201.

In one embodiment, a second isolation structure (not labeled) may be formed on the surface of the base substrate 200. The second isolation structure may cover a portion of the sidewall surfaces of each fin structure 201, and the top surface of the second isolation structure may be lower than the top surfaces of the plurality of fin structures 201.

In one embodiment, the second isolation structure may be made of silicon oxide or silicon oxynitride. The second isolation structure may be used to electrically isolate different semiconductor devices.

The dummy gate structure film 202 may include a dummy gate dielectric layer (not shown) formed on the base substrate 200 and covering the plurality of fin structures 201, and a dummy gate electrode layer formed on the top of the gate dielectric layer.

In one embodiment, the dummy gate dielectric layer may be made of a material including silicon oxide, and the dummy gate electrode layer may be made of a material including silicon.

In one embodiment, the first patterning process may include the following exemplary steps. A second mask layer (not shown) may be formed on the top of the dummy gate structure film 202. The second mask layer may expose a portion of the dummy gate structure film 202 formed between adjacent fin structures 201. Further, the plurality of openings 203 may be formed by etching the dummy gate structure film 202 using the second mask layer as an etch mask until the top surface of the second isolation structure is exposed.

In one embodiment, the second mask layer may be made of silicon nitride or titanium nitride. The second mask layer may be used as the mask for forming the plurality of openings 203.

In one embodiment, the method for etching the dummy gate structure film 202 using the second mask layer as the etch mask may include one or a combination of a dry etching process and a wet etching process.

In one embodiment, the formation of the plurality of openings 203 may be limited by the actual fabrication process, and thus the size of each opening 203 along the width direction of the fin structures 201 may not be formed small. For example, the size of the opening 203 along the width direction of the fin structures 201 may be in a range of approximately 30 nm to 60 nm.

In one embodiment, each opening 203 may be used to subsequently accommodate a first initial isolation structure.

Figure 6:
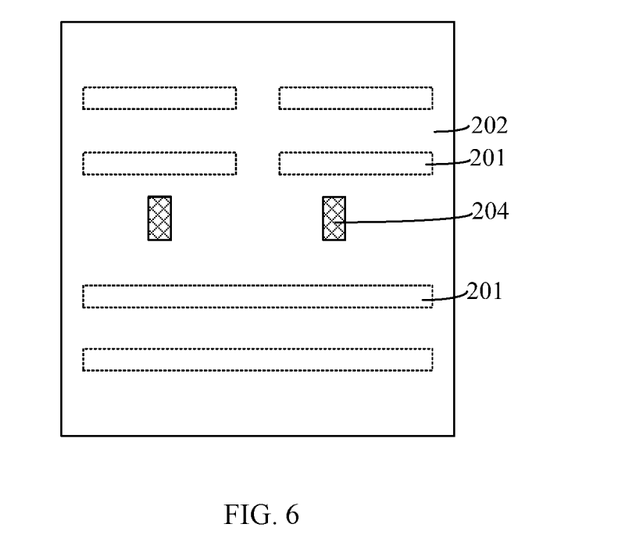

Further, returning to FIG. 16, a first initial isolation structure may be formed in each opening (S402). FIG. 6 illustrates a schematic top view of an exemplary semiconductor structure consistent with various embodiments of the present disclosure.

Referring to FIG. 6, a first initial isolation structure 204 may be formed in each opening 203 (referring to FIG. 5). That is, corresponding to the plurality of openings 203, a plurality of first initial isolation structures 204 may be formed. In one embodiment, the plurality of first initial isolation structures 204 may fill the plurality of openings 203.

In one embodiment, the method for forming the plurality of first initial isolation structures 204 may include the following exemplary steps. A first isolation material film may be formed in the plurality of openings 203. The first isolation material film may also formed on the top surface of the dummy gate structure film 202. The portion of the first isolation material film formed on the top surface of the dummy gate structure film 202 may be removed to expose the dummy gate structure film 202. As such, the plurality of first initial isolation structures 204 may be formed in the plurality of openings 203.

In one embodiment, the first isolation material film may be made of a material including silicon carbide, silicon oxynitride, silicon nitride, or silicon oxycarbide. The first isolation material film and the dummy gate dielectric layer may be made of different materials, such that when subsequently removing the dummy gate dielectric layer, the first isolation material film may not be removed.

In one embodiment, the first isolation material film may be formed by a process including chemical vapor deposition (CVD) or physical vapor deposition (PVD).

The method for removing the portion of the first isolation material film formed on the top surface of the dummy gate structure film 202 may include one or a combination of a dry etching process and a wet etching process.

In one embodiment, each first initial isolation structure 204 of the plurality of first initial isolation structures 204 may be used to form a first isolation structure in a subsequent process.

Figure 7:
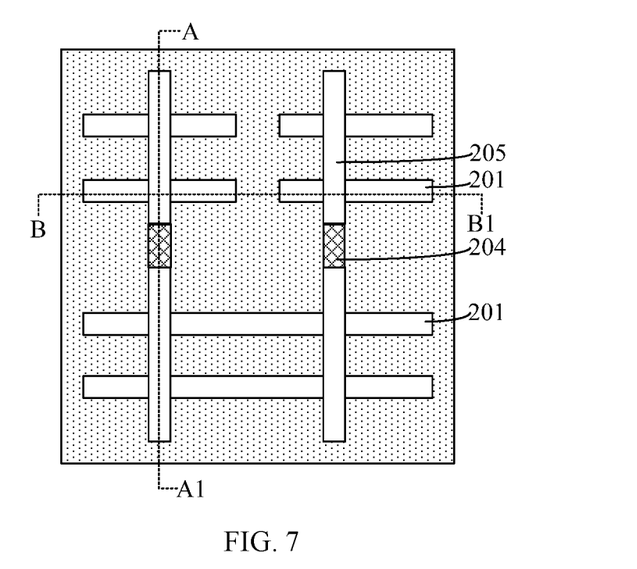
Figure 8:
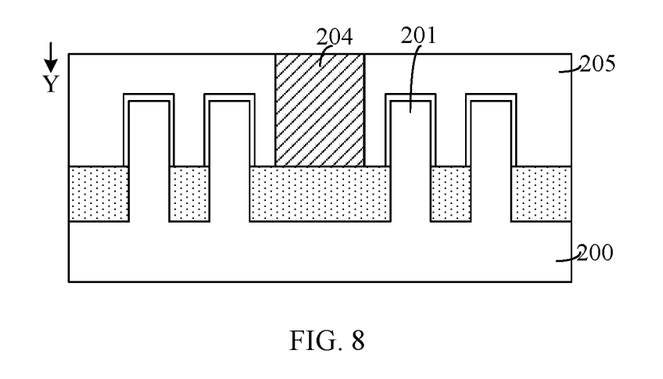
Figure 9:
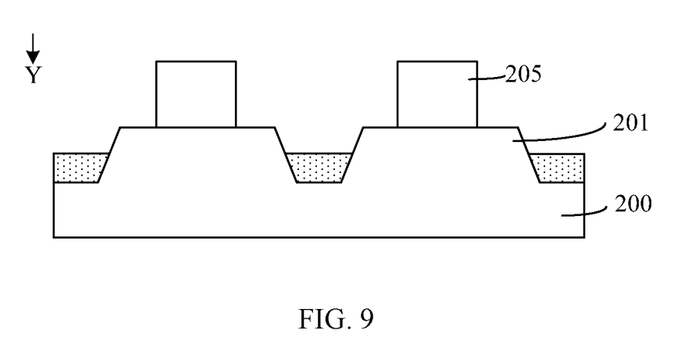

Further, returning to FIG. 16, after forming the plurality of first initial isolation structures, the dummy gate structure film may be patterned to form a plurality of dummy gate structures across the fin structures with each dummy gate structure in contact with a first initial isolation structure (S403). FIGS. 7-9 illustrate schematic views of a semiconductor structure consistent with various embodiments of the present disclosure. Specifically, FIG. 7 shows a schematic top view of the semiconductor structure, FIG. 8 shows a cross-sectional view of the semiconductor structure shown in FIG. 7 along an A-A1 line, and FIG. 9 shows a cross-sectional view of the semiconductor structure shown in FIG. 7 along a B-B1 line.

Referring to FIGS. 7-9, after forming the plurality of first initial isolation structures 204, a second patterning process may be performed on the dummy gate structure film 202 (referring to FIG. 6) to form a plurality of dummy gate structures 205. Each dummy gate structure 205 may be formed across the plurality of fin structures 201 and may be in contact with a first initial isolation structure 204.

In one embodiment, the second patterning process may include the following exemplary steps. First, a third mask layer (not shown) may be formed on the top of the dummy gate structure film 202. The third mask layer may cover a portion of the dummy gate structure film 202 formed on both sides of each first initial isolation structure 204 along the width direction of the fin structures 201. Further, the plurality of dummy gate structures 205 may be formed by etching the dummy gate structure film 202 using the third mask layer as an etch mask until the top surface of the second isolation structure is exposed.

In one embodiment, the third mask layer may be made of silicon nitride or titanium nitride. The third mask layer may be used as the mask for forming the plurality of dummy gate structures 205.

In one embodiment, the method for etching the dummy gate structure film 202 using the third mask layer as the etch mask may include one or a combination of a dry etching process and a wet etching process.

Through the first patterning process and the second patterning process, the size of the formed dummy gate structure 205 may be small, which may be conductive to improving the integration degree of semiconductor devices.

Figure 10:
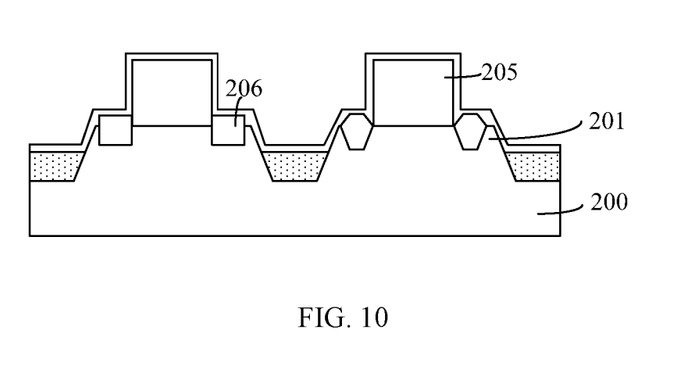

Further, returning to FIG. 17, a plurality of source/drain doped regions may be formed in the fin structures on both sides of each dummy gate structure, and a stop layer may be formed on the top of the plurality of source/drain doped regions (S404). FIG. 10 illustrates a schematic cross-sectional view of a semiconductor structure consistent with various embodiments of the present disclosure. The direction of the cross-sectional view shown in FIG. 10 is consistent with the direction of the cross-sectional view shown in FIG. 9.

Referring to FIG. 10, a plurality of source/drain doped regions 206 may be formed in the fin structures 201 on both sides of each dummy gate structure 205.

In one embodiment, prior to forming the plurality of source/drain doped regions, the fabrication method may further include forming sidewall spacers (not shown) on the sidewall surfaces of each dummy gate structure 205. The sidewall spacers may be used to define the positions of the plurality of source/drain doped regions 206. In one embodiment, the sidewall spacers may be made of a material including silicon nitride.

The method for forming the plurality of source/drain doped regions 206 may include the following exemplary steps. First, a plurality of source/drain openings may be formed in the fin structures 201 on both sides of each dummy gate structure 205. Further, an epitaxial layer may be formed in the plurality of source/drain openings. Doping ions may be introduced into the epitaxial layer to form the plurality of source/drain doped regions 206.

The material used to form the epitaxial layer and the conduction type of the doping ions may be related to the type of the transistor to be formed. For example, when the transistor to be formed is an N-type metal-semiconductor-oxide (NMOS) transistor, the epitaxial layer may be made of a material including silicon carbide or silicon, and the doping ions may be N-type doping ions, e.g. phosphor ions or arsenic ions; when the transistor to be formed is a P-type metal-semiconductor-oxide (PMOS) transistor, the epitaxial layer may be made of a material including germanium silicon or silicon, and the doping ions may be P-type doping ions, e.g. boron ions.

In one embodiment, after forming the source/drain doped regions 206, the fabrication method may also include forming a stop layer (not labeled) on the top of the source/drain doped regions 206. The stop layer may be made of a material including silicon nitride or titanium nitride. The stop layer may be used to protect the top surface of the source/drain doped regions 206 during a subsequent process of forming a plurality of plugs on the top of the source/drain doped regions 206.

Figure 11:
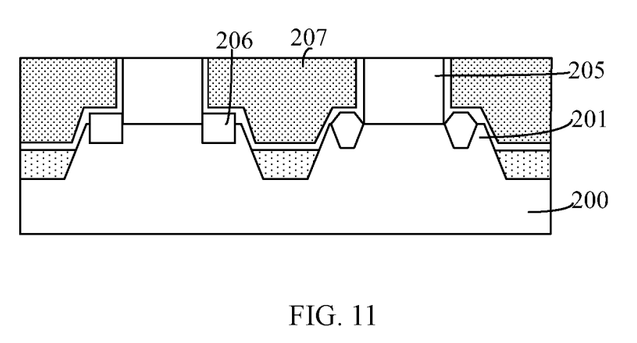
Figure 12:
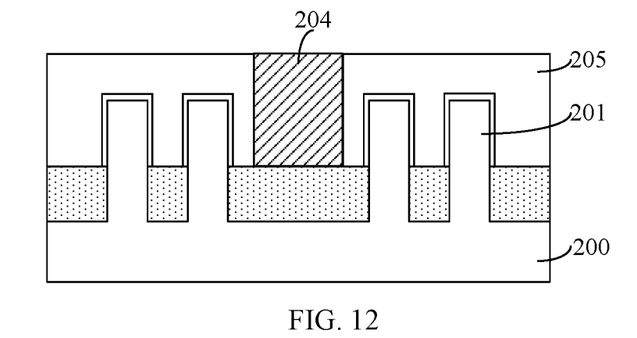

Further, returning to FIG. 16, a first dielectric layer exposing the top surfaces of the plurality of dummy gate structures may be formed on the top of the stop layer (S405). FIGS. 11-12 illustrate schematic cross-section views of a semiconductor structure consistent with various embodiments of the present disclosure. Specifically, the direction of the cross-sectional view shown in FIG. 11 is consistent with the direction of the cross-sectional view shown in FIG. 10, and the direction of the cross-sectional view shown in FIG. 12 is consistent with the direction of the cross-sectional view shown in FIG. 8.

Referring to FIGS. 11-12, a first dielectric layer 207 may be formed on the top of the stop layer. The first dielectric layer 207 may expose the top surfaces of the plurality of dummy gate structures.

In one embodiment, the fabrication method for forming the first dielectric layer 207 may include the following exemplary steps. First, a dielectric material film may be formed on the top of the stop layer. A portion of the dielectric material film may be removed to expose the top surfaces of the plurality of dummy gate structures 205. As such, the first dielectric layer 207 may be formed.

In one embodiment, the dielectric material film may be made of a material including silicon oxide or silicon oxynitride. The first dielectric layer 207 may be able to demonstrate desired isolation properties, which may be conducive to improving the performance of the semiconductor device.

Figure 13:
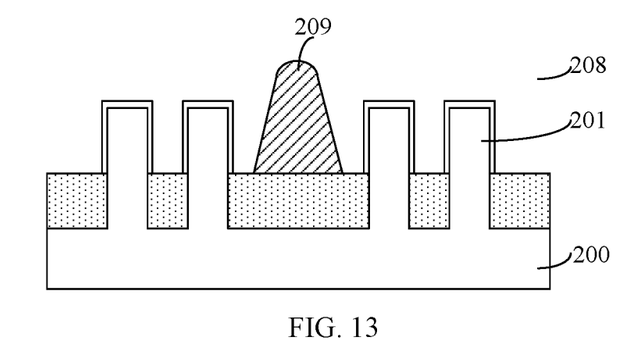

Further, returning to FIG. 16, the dummy gate electrode layer may be removed to form a plurality of dummy gate openings in the first dielectric layer, and after forming the plurality of dummy gate openings, a portion of each first initial isolation structure may be removed along the width direction of the fin structures to form a first isolation structure (S406). FIG. 13 illustrates a schematic cross-sectional view of a semiconductor structure consistent with various embodiments of the present disclosure. The direction of the cross-sectional view shown in FIG. 13 is consistent with the direction of the cross-sectional view shown in FIG. 12.

Referring to FIG. 13, the dummy gate electrode layer may be removed to form a plurality of dummy gate openings 208 in the first dielectric layer 207. Further, after forming the plurality of dummy gate openings 208, a portion of each first initial isolation structure 204 (referring to FIG. 12) may be removed along the width direction of the plurality of fin structures 201 to form a first isolation structure 209.

In one embodiment, the method for removing the dummy gate electrode layer may include one or combination of a dry etching process and a wet etching process.

In one embodiment, removing a portion of the first initial isolation structure 204 along the width direction of the fin structures 201 may be able to ensure a small dimension of the formed first isolation structure 209 in the width direction of the fin structures 201. Therefore, in the width direction of each fin structure 201, the dimension of the trench formed between the fin structure 201 and the first isolation structure 209 may be large, so that the subsequent formation of a gate structure in the trench may be less difficult. As such, cavities may be less likely generated in the gate structure that is formed in the trench, and thus the gate structure may demonstrate strong ability for controlling the fin structure 201, which may be conducive to improving the performance of the semiconductor device.

In one embodiment, an angle formed between the sidewall and the bottom of the first isolation structure 209 may be in a range of approximately 60° to 90°; along the width direction of the fin structure 201, the top dimension of the first isolation structure 209 may be smaller than the bottom dimension of the first isolation structure 209. For example, along the width direction of the fin structure 201, the top dimension of the first isolation structure 209 may be in a range of approximately 30 nm to 50 nm; and along the width direction of the fin structure 201, the bottom dimension of the first isolation structure 209 may be in a range of approximately 70 nm to 90 nm.

In other embodiments, the sidewall and the bottom of the first isolation structure may be perpendicular to each other.

In one embodiment, the minimum distance from the sidewall of a first isolation structure 209 to the sidewall of an adjacent fin structure 201 may in a range of approximately 20 nm to 40 nm.

In one embodiment, along the width direction of the fin structure 201, the top dimension of the first isolation structure 209 may be smaller than the bottom dimension of the first isolation structure 209. Therefore, during subsequent formation of the gate structure, the material of the gate structure may be able to slide down into the trench along the sidewall of the first isolation structure 209 and thus efficiently fill the corners of the trench, thereby preventing the formation of cavities in the gate structure at the corners of the trench. As such, the gate structure may demonstrate desired ability for controlling the fin structure 201, which may be conducive to further improving the performance of the semiconductor device.

Further, returning to FIG. 16, after forming the first isolation structure, a gate structure may be formed in each dummy gate opening (S407). FIGS. 14-15 illustrate schematic cross-section views of a semiconductor structure consistent with various embodiments of the present disclosure. Specifically, the direction of the cross-sectional view shown in FIG. 14 is consistent with the direction of the cross-sectional view shown in FIG. 13, and the direction of the cross-sectional view shown in FIG. 15 is consistent with the direction of the cross-sectional view shown in FIG. 11.

Referring to FIGS. 14-15, after forming the first isolation structure 209, a gate structure 210 may be formed in each dummy gate opening 208 (referring to FIG. 13).

In one embodiment, prior to forming the gate structure 210, the fabrication method may also include removing the portion of the dummy gate dielectric layer formed at the bottom of the dummy gate opening 208. The method for removing the portion of the dummy gate dielectric layer formed at the bottom of the dummy gate opening 208 may include one or a combination of a dry etching process and a wet etching process.

In one embodiment, because the dimension of the first isolation structure along the width direction of the fin structure 201 is small, the dimension of the trench formed between the fin structure 201 and the first isolation structure 209 may be large along the width direction of the fin structure 201. Therefore, forming a gate structure in the trench may be less difficult. As such, cavities may be unlikely formed in the gate structure 210 that is formed in the trench, and thus the gate structure 210 may demonstrate strong ability for controlling the fin structure 201, which may be conducive to improving the performance of the semiconductor device.

Moreover, because the top dimension of the first isolation structure 209 is smaller than the bottom dimension of the first isolation structure 209, the material of the gate structure 210 may be able to slide down into the trench along the sidewall of the first isolation structure 209 and thus efficiently fill the corners of the trench, thereby preventing the formation of cavities in the gate structure 210 at the corners of the trench. As such, the gate structure 210 may demonstrate desired ability for controlling the fin structure 201, which may be conducive to further improving the performance of the semiconductor device.

In one embodiment, the gate structure 210 may include a gate dielectric layer (not shown), and a gate electrode layer (not shown) formed on the gate dielectric layer. The gate dielectric layer may be made of a material with a high dielectric constant (e.g., a high-k dielectric material). For example, the gate dielectric layer may be made of a material including $HfO_2$, $La_2O_3$, HfSiON, $HfAlO_2$, $ZrO_2$, $Al_2O_3$, or $HfSiO_4$. The gate electrode layer may be made of a metal. For example, the gate electrode layer may be made of a material including Al, Cu, Ag, Au, Ni, Ti, W, WN, or WSi.

In one embodiment, after forming the gate structure 210, the method may further include removing a portion of the gate electrode layer, and forming a protective layer (not labeled) on the top of the gate electrode layer and the first dielectric layer 207. The protective layer may be made of a material including silicon nitride.

During the process of forming the first isolation structure 209, a portion of the first initial isolation structure 204 is removed such that the height of the formed first isolation structure 209 may be reduced. However, because a portion of the gate structure 210 is also removed, the flatness of the top of the gate structure and the first isolation structure 209 may still be desired. After subsequent formation of the protective layer on the top of the gate structure 210 and the first dielectric layer 207, the top of the protective layer may be flat, which may be conducive to improving the performance of the semiconductor device.

In one embodiment, after forming the protective layer, the method may also include forming a second dielectric layer on the top of the first dielectric layer 207, the first isolation structure 209, and the protective layer; forming a plurality of first contact holes in the first dielectric layer 207 and the second dielectric layer by removing the portion of the first dielectric layer 207 and the second dielectric layer formed on the top of the plurality of source/drain doped regions 206 to expose the top surface of the source/drain doped regions 206; forming a plurality of second contact holes in the second dielectric layer and the protective layer by removing a portion of the second dielectric layer and the protective layer formed on the top of the plurality of gate structures 210 to expose the top surfaces of the plurality of gate structures 210; forming a first plug in each first contact hole; and forming a second plug in each second contact hole.

With the improvement of the integration degree of semiconductor devices, the size of the devices continuously decreases. According to the present disclosure, the top of the gate structure 210 is covered by a protective layer. Therefore, during the process of forming the first contact hole, even when the first contact hole is offset onto the gate structure 210, the gate structure may still not be damaged because of the protection on the top of the gate structure 210 provided by the protective layer. As such, the performance of the semiconductor device may be improved.

Further, the present disclosure also provides a semiconductor structure. FIG. 14 illustrates a schematic cross-sectional view of a semiconductor structure consistent with various embodiments of the present disclosure.

Referring to FIG. 14, the semiconductor structure may include a base substrate 200, and a plurality of fin structures 201 formed on the surface of the base substrate 200. The plurality of fin structures 201 may be parallel to each other.

In one embodiment, the base substrate 200 and the plurality of fin structures 201 may be made of silicon. In other embodiments, the base substrate and the plurality of fin structures may be made of germanium, SiGe, SOI, or GOI.

The semiconductor structure may also include a first dielectric layer 207 (referring to FIG. 11) formed on the top of the base substrate 200. Further, the semiconductor structure may include a plurality of first isolation structures 209 formed in the first dielectric layer 207. Along the width direction of the fin structures 201, each first isolation structure 209 may have a top dimension smaller than a bottom dimension. The semiconductor structure may include two dummy gate openings 208 (referring to FIG. 13) formed in the first dielectric layer on the two sides of each first isolation structure 209, respectively. Each dummy gate opening 208 may expose the sidewall surface of the corresponding first isolation structure 209. The semiconductor structure may further include a gate structure 210 formed in each dummy gate opening 208.

The angle formed between the sidewall and the bottom of the first isolation structure 209 may be in a range of approximately 60° to 90°; along the width direction of the fin structures 201, the top dimension of the first isolation structure 209 may be smaller than the bottom dimension of the first isolation structure 209.

In one embodiment, along the width direction of the fin structure 201, the top dimension of the first isolation structure 209 may be in a range of approximately 30 nm to 50 nm; and along the width direction of the fin structure 201, the bottom dimension of the first isolation structure 209 may be in a range of approximately 70 nm to 90 nm.

In one embodiment, the first isolation structure 209 may be made of a material including silicon carbide, silicon oxynitride, silicon nitride, or silicon oxycarbide.

In one embodiment, the minimum distance from the sidewall of a first isolation structure 209 to the sidewall of an adjacent fin structure 201 may in a range of approximately 20 nm to 40 nm.

Further, the semiconductor structure may also include a second isolation structure (not labeled) formed on the surface of the base substrate 200. The second isolation structure may cover a portion of the sidewall surfaces of each fin structure 201, and the top surface of the second isolation structure may be lower than the top surfaces of the plurality of fin structures 201.

The semiconductor structure may further include a plurality of source/drain doped regions 206 (referring to FIG. 8)

formed in the fin structures 201 on both sides of each gate structure 210; a second dielectric layer formed on the top of the first dielectric layer 207, the first isolation structure 209, and the plurality of gate structures 210; a plurality of first contact holes formed in the first dielectric layer 207 and the second dielectric layer and exposing the top surfaces of the plurality of source/drain doped regions 206; a plurality of second contact holes formed in the second dielectric layer and exposing the top surface of the gate structures 210; a plurality of first plugs formed in the plurality of first contact holes; and a plurality of second plugs formed in the plurality of second contact holes.

Compared to conventional semiconductor structures and fabrication methods, the disclosed semiconductor structures and fabrication methods may demonstrate the following advantages.

According to the disclosed semiconductor structures and fabrication methods, after forming a dummy gate opening, a portion of a first initial isolation structure is removed along the width direction of the fin structure to form a first isolation structure to ensure a small dimension of the first isolation structure along the width direction of the fin structure. That is, the dimension of the trench formed between the fin structure and the first isolation structure may be large. Therefore, the subsequent formation of a gate structure in the trench may be less difficult. As such, cavities may be less likely generated in the gate structure that is formed in the trench, and thus the gate structure may demonstrate strong ability for controlling the fin structure, which may be conducive to improving the performance of the semiconductor device.

Further, along the width direction of the fin structure, the top dimension of the first isolation structure is smaller than the bottom dimension of the first isolation structure. Therefore, during subsequent formation of the gate structure, the material of the gate structure may be able to slide down into the trench along the sidewall of the first isolation structure and thus efficiently fill the corners of the trench, thereby preventing the formation of cavities in the gate structure at the corners of the trench. As such, the gate structure may demonstrate desired ability for controlling the fin structure, which may be conducive to further improving the performance of the semiconductor device.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
    forming a plurality of fin structures on a base substrate;
    forming a plurality of dummy gate structures across the plurality of fin structures, and a plurality of first initial isolation structures between adjacent dummy gate structures, wherein along an extension direction of the plurality of dummy gate structures, both sides of each first initial isolation structure of the plurality of first initial isolation structures are in contact with a dummy gate structure;
    forming a first dielectric layer on a top surface of the base substrate, top and sidewall surfaces of the plurality of fin structures, sidewall surfaces of the plurality of dummy gate structures, and sidewall surfaces of the plurality of first initial isolation structure;
    removing the plurality of dummy gate structures to form a plurality of dummy gate openings in the first dielectric layer;
    after forming the plurality of dummy gate openings, removing a portion of each first initial isolation structure along a width direction of the plurality of fin structures to form a first isolation structure, wherein along the width direction of the plurality of fin structures, the first isolation structure has a top dimension smaller than a bottom dimension; and
    after forming the plurality of first isolation structures, forming a plurality of gate structures in the plurality of dummy gate openings.

2. The method according to claim 1, wherein forming the plurality of dummy gate structures and the plurality of first initial isolation structures includes:
    forming a dummy gate structure film on the top surface of the base substrate, the top and sidewall surfaces of the plurality of fin structures;
    forming a plurality of openings between adjacent fin structures to expose the top surface of the base substrate by patterning the dummy gate structure film through a first patterning process;
    forming the plurality of first initial isolation structures in the plurality of openings; and
    after forming the plurality of first initial isolation structures, forming the plurality dummy gate structures by patterning the dummy gate structure film through a second patterning process.

3. The method according to claim 2, prior to forming the dummy gate structure film, further including:
    forming a second isolation structure on the top surface of the base substrate, wherein the second isolation structure partially covers the sidewall surfaces of the plurality of fin structures, and a top surface of the second isolation structure is lower than the top surfaces of the plurality of fin structures.

4. The method according to claim 1, wherein:
    the plurality of dummy gate structures includes a dummy gate dielectric layer; and
    the dummy gate dielectric layer is made of a material including silicon oxide.

5. The method according to claim 4, wherein:
    the plurality of first initial isolation structures and the dummy gate dielectric layer are made of different materials.

6. The method according to claim 5, wherein:
    the plurality of first initial isolation structures is made of a material including silicon carbide, silicon oxynitride, silicon nitride, or silicon oxycarbide.

7. The method according to claim 1, wherein:
    an angle between a sidewall surface and a bottom surface of each first isolation structure of the plurality of first isolation structures is in a range of approximately 60° to 90°.

8. The method according to claim 7, wherein:
    along the width direction of the plurality of fin structures, the top dimension of the first isolation structure is in a range of approximately 30 nm to 50 nm; and
    along the width direction of the plurality of fin structures, the bottom dimension of the first isolation structure is in a range of approximately 70 nm to 90 nm.

9. The method according to claim 1, wherein:
a minimum distance from a sidewall of a first isolation structure to a sidewall of an adjacent fin structure is a range of approximately 20 nm to 40 nm.

10. The method according to claim 1, after forming the plurality of dummy gate structures and prior to forming the first dielectric layer, further including:
forming a plurality of source/drain doped regions in the plurality of fin structures on both sides of each dummy gate structure of the plurality of dummy gate structures.

11. The method according to claim 1, wherein forming the plurality of gate structures in the plurality of dummy gate opening includes:
forming a gate dielectric layer in the plurality of dummy gate openings; and
forming a gate electrode layer on the gate dielectric layer, wherein:
the gate dielectric layer is made of a material including $HfO_2$, $La_2O_3$, HfSiON, $HfAlO_2$, $ZrO_2$, $Al_2O_3$, or HfSiO4; and
the gate electrode layer is made of a material including Al, Cu, Ag, Au, Ni, Ti, W, WN, or WSi.

* * * * *